United States Patent [19]
Cochran et al.

[11] Patent Number: 5,671,257
[45] Date of Patent: Sep. 23, 1997

[54] SYMBOL TIMING RECOVERY BASED ON COMPLEX SAMPLE MAGNITUDE

[75] Inventors: Bruce A. Cochran, Mesa; Ronald D. McCallister, Scottsdale, both of Ariz.

[73] Assignee: Sicom, Inc., Scottsdale, Ariz.

[21] Appl. No.: 468,921

[22] Filed: Jun. 6, 1995

[51] Int. Cl.$^6$ ............................................. H04L 7/00
[52] U.S. Cl. .......................................... 375/355; 328/72
[58] Field of Search ................................. 375/355, 354, 375/376, 371; 327/91, 299, 141; 328/72

[56] References Cited

U.S. PATENT DOCUMENTS

| | | | |
|---|---|---|---|
| 4,704,582 | 11/1987 | Dixon et al. | 329/50 |
| 4,941,155 | 7/1990 | Chuang et al. | 375/84 |
| 5,151,920 | 9/1992 | Haagh et al. | 375/200 |
| 5,440,265 | 8/1995 | Cochran et al. | 375/362 |

OTHER PUBLICATIONS

EDN "Undersmapling Reduces data–acquisition costs for Select Applications" by jeff Kristen et al., pp. 217–228 1990.
"Timing Recovery in Digital Synchronous Data Receivers" Mueller and Muller, IEEE Trans. On Comm. vol. 24, No. 5 May 1976.
"Interpolation in Digital Modems –Part II: Implementation and Performance. Erup, Gardner, Harris, IEEE " vol.41 No. 6 Jun. 1993.
"Intepolation in Digital MOdems–Part I: Fundamentals Gardner, IEE Trans. on Comm " vol. 41, No. 3, Mar. 1993.
"Symbol Synchronizer Performance affected by Non–Ideal Interpolation in Digital Modems in Digital Modems" Bucket and Moeneclaey, IEEE 0–7803–1825 0/94.
The Performance of Two Symbols Timing Recovery Algorithms for PSK Demodulators. Cowley and Sabel, IEEE 0090–678/94 1994.
A Continuously Variable Digital Delay Element. Farrow, C.W. IEEE CH2458–8–88–0000–2641 1988.
A New Variable Fractional Sample Delay Filter with Non––Linear Interpolation. Liu & Wei. IEEE Trans vol. 39 No. 2 1992.
The Effect of Interpolation on the BER Performance of Narrowbank BPSK and (O) QPSK on Rician–FAding Channels Bucket and Moeneclaey. IEEE Trans on Comm. vol 42 #11 Nov. 1994.
On Sampling Rate, Analog Prefiltering, and Sufficient Statistics for Digital Receivers. Meyr, Oerder, Polydoros IEEE Trans on Comm. vol. 42 No. 12, Dec. 1994.

*Primary Examiner*—Tesfaldet Bocure
*Attorney, Agent, or Firm*—Meschkow & Gresham, P.L.C.

[57] ABSTRACT

A digital communication receiver (10) takes one complex sample (20) of a baseband analog signal (12) per symbol. A rectangular to polar converter (26) separates phase attributes of the complex samples from magnitude attributes. A phase processor (28) identifies clock adjustment opportunities which occur when relatively large phase changes take place between consecutive symbols. A magnitude processor (32) influences symbol timing only during clock adjustment opportunities. The magnitude processor (32) advances symbol timing in a phase locked loop when decreasing magnitude changes are detected during clock adjustment opportunities and retards symbol timing when increasing magnitude changes are detected during clock adjustment opportunities. An interpolator (66) may be used to estimate magnitude values between samples so that magnitude change is determined between sampled magnitude values and estimated magnitude values.

24 Claims, 2 Drawing Sheets

SYMBOL TIMING RECOVERY BASED ON COMPLEX SAMPLE MAGNITUDE

TECHNICAL FIELD OF THE INVENTION

The present invention relates generally to the field of digital communications. More specifically, the present invention relates to synchronizing digital receivers to symbol timing.

BACKGROUND OF THE INVENTION

In digital communication receivers, component cost, reliability, and power consumption improvements may be realized by operating at lower clock rates or by requiring fewer components. However, the purpose of a digital communication receiver is to recover transmitted information, and greater amounts of information may be recovered when receivers detect data at higher data rates. Conventionally, operation at higher data rates requires operating at higher clock rates or increasing the number of components while simultaneously operating parallel channels.

One particularly troublesome feature of digital communication receivers has been symbol synchronization. A symbol is a discrete interval of time within which a received signal conveys a unit of data. The unit of data may include one or more bits, and the resulting data rate is proportional to the symbol rate. Conventional digital communication receivers compute symbol synchronization timing errors by detecting points where quadrature components of complex signals experience zero-crossings. Unfortunately, these points are difficult to detect. Consequently, symbol synchronization in conventional digital communication receivers has required an incoming analog signal to be sampled at a rate of two or more complex samples per symbol. However, once symbol synchronization has been achieved only one complex sample per symbol is actually required for data detection. Thus, the symbol synchronization feature has conventionally required digital receivers to operate at a greater clock rate than is required for data detection.

Moreover, the zero-crossing points are the worst possible sampling points within the symbols. Consequently, symbol synchronization occurs when sampling points are driven as far from the zero-crossing points as possible. Unfortunately, this technique leads to sub-optimum operation because the detected feature (i.e. zero-crossing points) is not the signal feature which defines optimal sampling points.

A few prior digital receivers have achieved symbol synchronization using only one complex sample per symbol. However, such digital receivers have been extremely sensitive to carrier synchronization and frequency offsets, such as may be caused by Doppler. In other words, such receivers have been useful only in situations which required carrier synchronization along with rigid control of frequency offsets. These receivers are virtually useless in situations which require fast acquisition or operation in the presence of significant frequency offsets.

SUMMARY OF THE INVENTION

Accordingly, it is an advantage of the present invention that an improved symbol synchronization apparatus and method are provided.

Another advantage is that the present invention may digitally recover symbol timing based upon less than two complex samples per symbol.

Another advantage is that the present invention tolerates significant frequency offsets.

Another advantage is that the present invention quickly acquires symbol timing.

The above and other advantages of the present invention are carried out in one form within a digital communication receiver by a method of recovering symbol synchronization timing from an analog signal configured as a stream of symbols. The method generates a clock signal which defines symbol timing. The analog signal is sampled in response to the clock signal to generate a complex sample for each symbol. Magnitude attributes of the complex samples are separated from phase attributes of the complex samples so that the magnitude attributes are substantially insensitive to phase changes. The symbol timing defined by the clock signal is adjusted in response to at least a portion of the magnitude attributes.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
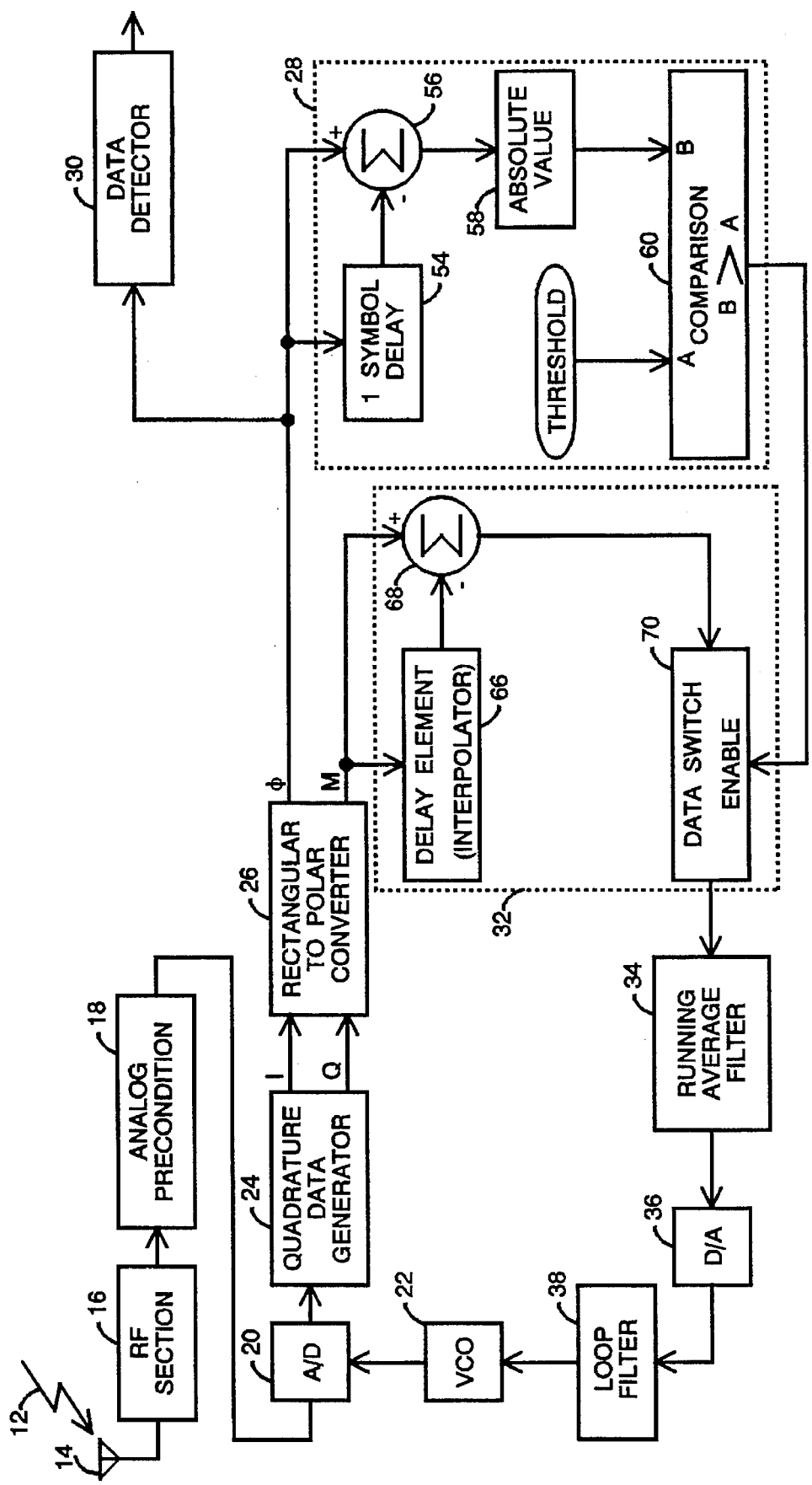
FIG. 1 shows a block diagram of a digital communication receiver configured in accordance with the present invention.

FIG. 1 shows a block diagram of a digital communication receiver 10. Receiver 10 recovers digital data from an incoming analog carrier signal 12. Carrier signal 12 is configured as a stream of discrete symbol intervals, called symbols below. The symbols are of equivalent duration, and each symbol conveys a unit of data. A unit of data conveys one or more bits. Desirably, signal 12 is modulated using some form of non-constant-envelope modulation, such as M-ary PSK, N-QAM, and the like.

Signal 12 is received at an antenna 14. Antenna 14 couples to an RF section 16. RF section 16 may include RF filtering, a fixed frequency oscillator, down conversion circuits, and other components conventionally included in RF sections of radio receivers. RF section 16 preferably generates an essentially baseband, analog form of signal 12. An output of RF section 16 couples to an input of an analog precondition circuit 18. Circuit 18 includes anti-aliasing filtering, automatic gain control (AGC), and other circuits commonly used to condition an analog signal for digitizing. An output of precondition circuit 18 couples to a signal input of an analog-to-digital (A/D) converter 20. A/D converter 20 digitizes the baseband form of signal 12 into samples which characterize the amplitude of the baseband form of signal 12 at various sampling instants.

An output of a voltage controlled oscillator (VCO) 22 generates a clock signal that defines the timing at which A/D converter 20 samples signal 12. In the preferred embodiment, VCO 22 oscillates at less than two times the symbol rate for signal 12, and preferably at approximately one times the symbol rate. A/D converter 20 takes less than two and preferably just one complex sample for each symbol. A symbol synchronizer configured in accordance with the present invention adjusts the symbol timing so that the complex sample taken for each symbol occurs at a desirable point within the symbol.

An output of A/D converter 20 couples to a quadrature data generator 24. Quadrature data generator 24 converts the digital samples of signal 12 into digital rectangular coordinate characterizations of the signal's I and Q quadrature components. The preferred embodiment uses a well known Hilbert transformation technique to convert sampled carrier data pairs into I and Q data values, but other techniques known to those skilled in the art may be used as well. These I and Q data values express I and Q quadrature components in accordance with a rectangular coordinate system. In the preferred embodiment, quadrature data generator 24 produces one complex sample which includes I and Q data values for each symbol.

Quadrature data generator 24 has an I output and a Q output, each of which couples to a rectangular to polar converter 26. Converter 26 generates phase angle ($\phi$) and magnitude (M) attribute values which correspond to phase relationships expressed between the I and Q quadrature values provided by quadrature data generator 24. In the preferred embodiment, a Cordic conversion process is used in separating phase attributes of complex samples from magnitude attributes, but those skilled in the art can adapt other techniques, such as table look-ups and the like, in particular applications. Converter 26 preferably makes one conversion for each symbol.

A phase output of converter 26 couples to a phase processor 28 and to a data detector 30. Phase processor 28 processes phase values apart from magnitude values to aid in recovering symbol timing. For PSK forms of modulation, data detector 30 uses the phase values obtained from the complex samples to recover the data conveyed by signal 12. For QAM forms of modulation, data detector 30 may additionally use magnitude values, or data detector 30 may alternatively use I and Q values. An output from data detector 30 provides a stream of data corresponding to the data conveyed by signal 12. In addition, data detector 30 may provide soft decision data.

A magnitude output of converter 26 couples to a magnitude processor 32. Magnitude processor 32 processes magnitude values to aid in recovering symbol timing. In particular, magnitude processor 32 receives an enabling input from phase processor 28. This enabling input identifies when to allow magnitude attribute data to influence adjustments made to symbol timing. An output from magnitude processor 32 couples to a running average filter 34, an output of which drives a digital-to-analog (D/A) converter 36. D/A converter 36 has an output which couples to an input of a loop filter 38, and an output of loop filter 38 couples to a control input of VCO 22.

Figure 2:
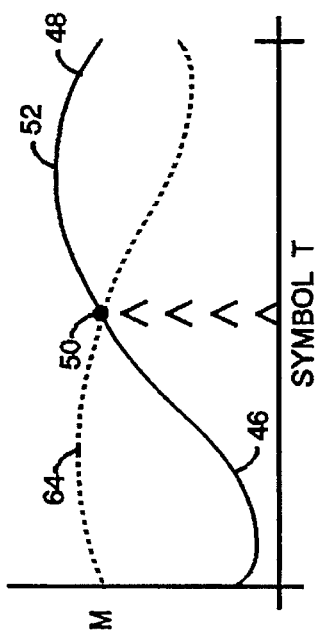
FIG. 2 shows a phase constellation diagram.

FIG. 2 shows a phase constellation diagram for QPSK modulation. Those skilled in the art will appreciate that FIG. 2 illustrates QPSK modulation as a mere example which aids teaching the present invention and that the present invention is not limited to this form of modulation. FIG. 2 depicts four complex points 40a, 40b, 40c, and 40d. Points 40a–40d illustrate theoretically ideal relationships between inphase (I) and quadrature (Q) components of signal 12 for the purpose of conveying two bits of data in a single symbol. Only one of the relationships depicted by complex points 40a–40d is conveyed during any single symbol. A/D converter 20, quadrature data generator 24, and rectangular to polar converter 26 (see FIG. 1) together generate a complex sample for each symbol which desirably resembles one of points 40a–40d. However, this complex sample invariably fails to precisely equal any of points 40a–40d due to the presence of noise and other factors. Data detector 30 (see FIG. 1) identifies the particular two bits of data being conveyed during a symbol by determining which one of the complex points 40a–40d the complex sample most closely resembles.

In addition to noise, symbol timing is one of the factors that determines how closely the complex samples resemble points 40a–40d. Transition tracks 42, 44, and 46 depict exemplary changes which can occur in I-Q relationships as data conveyed by signal 12 (see FIG. 1) changes from one symbol to the next. If symbol timing is not approximately correct, the complex samples upon which receiver 10 (see FIG. 1) operate may correspond to any location on a transition track 42, 44, or 46 rather than to points 40a–40d. Consequently, the farther a sampling instant is within a symbol from approximately correct symbol timing, the more likely that data detector 30 will generate bad data.

FIG. 2 illustrates that both phase and magnitude attributes of the complex relationship change as signal 12 transitions among points 40a–40d. Unfortunately, the phase attribute may further change due to other normally encountered factors, such as frequency offsets caused by imperfect carrier synchronization, Doppler, and the like. The influence of frequency offsets on the phase attribute makes the use of phase information to determine proper symbol timing undesirable. A significant portion of phase information may characterize frequency offsets rather than legitimate transitions between points 40a–40d. On the other hand, the magnitude attribute changes as signal 12 transitions between points 40a–40d but remains relatively insensitive to frequency offsets.

Figure 3:
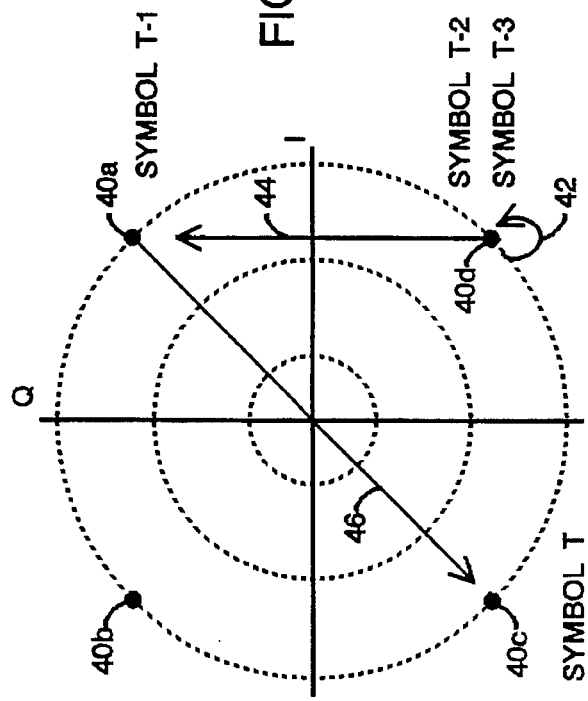
FIG. 3 shows a timing diagram of an exemplary magnitude signal.

FIG. 3 shows a timing diagram of an exemplary magnitude component 48 of signal 12 as it transitions from a symbol T-3, through symbols T-2, T-1, and T. FIG. 3 illustrates a particular set of data conveyed by signal 12 during symbols T-3 through T as an example for the purpose of teaching the present invention. Those skilled in the art will appreciate that the present invention is not limited to any particular data combinations. The exemplary data combination depicted in FIG. 3 transitions 0 radians in phase between symbols T-3 and T-2, $\pi/2$ radians in phase between symbols T-2 and T-1, and $\pi$ radians between symbols T-1 and T. Thus, magnitude component 48 depicts the magnitude attribute of transition tracks 42, 44, and 46, respectively, shown in FIG. 2.

Desirably, sampling instants 50 are centrally located within the symbols and occur in receiver 10 when signal 12 most closely exhibits the I-Q relationships depicted by points 40a–40d (see FIG. 2). Generally, magnitude changes little when phase changes little, but magnitude generally decreases then increases between sampling instants 50 as phase changes are encountered. Moreover, the amount of decrease and increase becomes more pronounced as the amount of phase change increases.

During transition track 42, magnitude information does not suggest how to adjust the VCO clock signal which defines symbol timing. Moreover, as illustrated in FIG. 3, magnitude may even exhibit a slight increase followed by a slight decrease during track 42, which is opposite to the magnitude signal behavior exhibited during tracks 44 and 46 where greater amounts of phase change are encountered. Accordingly, during track 42, any adjustment to symbol timing based upon magnitude attributes is at least as likely to diverge away from optimum sampling instants as it is to converge toward optimum sampling instants 40. Accordingly, magnitude change situations like those demonstrated by track 42 are defined not to be clock adjustment opportunities.

On the other hand, tracks 44 and 46 illustrate a consistent signal behavior. As sampling instants 50 generally approach the points in time where the magnitude attribute reaches a maximum and move away from the points in time where the magnitude attribute reaches a minimum, then sampling instants 50 are roughly converging upon the optimum points. However, as illustrated at point 52, sampling instants 50 are desirably not timed precisely where the magnitude attribute is maximized. In PSK modulation formats, overshoot or ringing often causes the magnitude attribute to reach a maximum after passing an optimum sampling instant 50. In QAM modulation formats, some data states are conveyed at a reduced magnitude compared to others. Accordingly, magnitude change situations like those demonstrated by tracks 44 and 46 are defined to be clock adjustment opportunities.

Referring back to FIG. 1, phase processor 28 evaluates phase attributes to distinguish clock adjustment opportunities from intervals which are not clock adjustment opportunities. However, phase processor 28 operates upon differential phase, which is relatively insensitive to frequency offsets. In particular, phase values for each symbol are supplied to a one symbol delay element 54 and to a positive input of a subtractor 56. An output of delay element 54 couples to a negative input of subtractor 56. An output of subtractor 56 couples to an absolute value element 58, and an output of absolute value element 58 couples to a "B" input of a comparison element 60. A constant threshold value is applied at an "A" input of comparison element 60. An output of comparison element 60 activates when a phase change value at the "B" input is greater than the threshold value at the "A" input. This output couples to magnitude processor 32.

At a current instant, delay element 54 provides a phase value which was valid for a past instant. In particular, the past instant is one symbol delayed from the current instant. Thus, subtractor 56 determines changes in phase attributes between consecutive symbols. These changes are relatively insensitive to frequency offsets because any frequency offset occurring over an interval of only a single symbol typically causes only a minor phase error. Absolute value element 58 strips away any positive or negative sign information so that raw phase change data are provided to comparison element 60.

Phase processor 28 identifies clock adjustment opportunities in response to phase changes. Larger amounts of phase change occurring in a given unit of time (i.e. one symbol delay) are defined to be clock adjustment opportunities while smaller amounts of phase change are defined not to be clock adjustment opportunities. The threshold value supplied to the "A" input of comparison element 60 sets the threshold which defines the difference between clock adjustment opportunities and "not" clock adjustment opportunities. The precise value for this threshold is not a critical parameter in the present invention. Acceptable results appear to be obtainable so long as the threshold is set greater than $\pi/4$ radians, with even better results when the threshold is set to greater than $\pi/2$ radians.

The better results are a consequence of greater phase changes. Referring back to FIG. 3, during symbol T, maximum magnitude point 52 occurs significantly after desired sampling instant 50. For amounts of phase change greater than $\pi/2$ radians, point 52 occurs at approximately ¾ the duration of symbol T after the beginning of symbol T.

Figure 4:
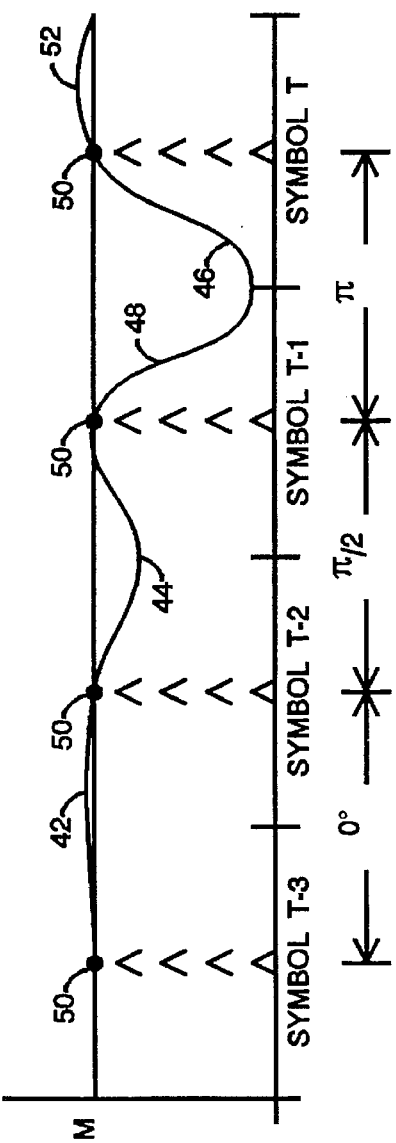
FIG. 4 shows a timing diagram of an exemplary magnitude signal and a delayed estimate of the magnitude signal.

FIG. 4 shows a timing diagram of exemplary magnitude signal 48 during symbol T (see FIG. 2) while signal 48 follows transition track 46 (see FIGS. 2 and 3). In addition, FIG. 4 shows a delayed estimate 64 of magnitude signal 48. The intersection of delayed estimate signal 64 and magnitude signal 48 occurs approximately in the center of symbol T and is approximately coincident with desired sampling instant 50.

Referring back to FIG. 1, magnitude processor 32 includes a delay element 66 and a subtractor 68. A positive input of subtractor 68 and an input of delay element 66 each receive magnitude attributes of the I-Q relationship for each symbol. An output of delay element 66 couples to a negative input of subtractor 68. An output of subtractor 68 couples to a data input of a data switch 70. The enabling signal provided by comparison element 60 of phase processor 28 is routed to an enable input of data switch 70, and an output of data switch 70 couples to an input of running average filter 34.

For each current instant, delay element 66 produces an estimate of the value exhibited by magnitude signal 48 (see FIG. 4) at a past instant. In the preferred embodiments, delay element 66 is an interpolator which has a fixed delay of one-half the symbol duration. Thus, for each symbol, delay element 66 provides an estimate of the value magnitude signal 48 would have exhibited had it been sampled one-half of a symbol earlier. In the preferred embodiment, a Farrow interpolation structure is used to estimate magnitude between samples, but those skilled in the art can adapt other interpolation and filtering techniques in particular applications. Consequently, delay element 66 generates delay estimate 64 (see FIG. 4) during symbol T.

Referring to FIGS. 1 and 4, those skilled in the art will appreciate that interpolator 66 need not precisely estimate a delayed version of magnitude signal 48 (see FIG. 4). For example, precise magnitude values are less important than the shape of delayed estimate 64 in response to various sampling instants throughout symbol T. For example, this shape causes delayed estimate to reach a maximum value prior to desired sampling point 50 and to reach a minimum value after desired sampling point 50 for the large phase change situation depicted by symbol T.

Subtractor 68 detects changes occurring in magnitude attributes over at least portions of symbols. This magnitude change between the estimated delayed magnitude and the current magnitude is fed through data switch 70 when enabled by phase processor 28. As discussed above, phase processor 28 enables data switch 70 during clock adjustment opportunities. Magnitude processor 32 and running average filter 34 are configured so that magnitude changes occurring while not a clock adjustment opportunity have substantially no influence over symbol timing.

The magnitude change data occurring during clock adjustment opportunities are used in a phase locked loop to adjust symbol timing. In particular, polarities are arranged so that decreasing magnitude changes urge VCO 22 to delay the clock signal so that sampling instant 50 is moved later within a symbol. The decreasing magnitude situation is depicted in the region to the left of desired sampling point 50 in FIG. 4. Likewise, increasing magnitude changes urge VCO 22 to advance the clock signal so that sampling instant 50 is moved earlier. The increasing magnitude situation is depicted in the region to the right of desired sampling point 50 in FIG. 4.

Running average filter 34 and loop filter 38 together insure that the results from any single symbol have only a minor influence over symbol timing and general trends detected by magnitude processor 32 are used to control symbol timing.

In summary, the present invention provides an improved symbol synchronization apparatus and method. The present invention may digitally recover symbol timing based on less than two complex samples per symbol. Significant frequency offsets are tolerated because symbol timing adjustments are based primarily upon magnitude attributes which have been separated from phase attributes of complex samples. Due to tolerance of frequency offsets and to identification of clock adjustment opportunities, the present invention quickly acquires symbol timing.

The present invention has been described above with reference to preferred embodiment. However, those skilled in the art will recognize that changes and modifications may be made in these preferred embodiments without departing from the scope of the present invention. For example, those skilled in the art will appreciate that the digital portions of the present invention may be implemented either using discrete components or within a digital signal processor. In addition, those skilled in the art will appreciate that the duration over which magnitude change is estimated may be extended or reduced, and that if extended, clock adjustment opportunities may be defined as particular phase changes occurring over more than one symbol. These and other changes and modifications which are obvious to those skilled in the art are intended to be included within the scope of the present invention.

What is claimed is:

1. In a digital communication receiver, a method of recovering symbol timing from an analog signal configured as a stream of symbols, said method comprising the steps of:
   generating a clock signal which defines symbol timing;
   sampling said analog signal in response to said clock signal to generate less than two complex samples for each symbol;
   separating magnitude attributes of said less than two complex samples for each symbol from phase attributes of said less than two complex samples for each symbol so that said magnitude attributes are substantially insensitive to phase changes; and
   adjusting said symbol timing defined by said clock signal in response to at least a portion of said magnitude attributes.

2. In a digital communication receiver, a method of recovering symbol timing from an analog signal configured as a stream of symbols, said method comprising the steps of:
   generating a clock signal which defines symbol timing;
   sampling said analog signal in response to said clock signal to generate a complex sample for each symbol;
   separating magnitude attributes of said complex samples from phase attributes of said complex samples so that said magnitude attributes are substantially insensitive to phase changes;
   identifying clock adjustment opportunities in response to said phase attributes of said complex samples; and
   enabling at least a portion of said magnitude attributes which are approximately coincident with said clock adjustment opportunities to adjust said symbol timing; and
   adjusting said symbol timing defined by said clock signal in response to said portion of said magnitude attributes.

3. A method of recovering symbol timing as claimed in claim 2 wherein:

said identifying step comprises the step of determining changes occurring in said phase attributes; and
   said clock adjustment opportunities are identified in response to said changes in said phase attributes.

4. A method of recovering symbol timing as claimed in claim 3 wherein said identifying step further comprises the steps of:
   defining occurrences of relatively larger phase change as being clock adjustment opportunities; and
   defining occurrences of relatively smaller phase change as not being clock adjustment opportunities.

5. A method of recovering symbol timing as claimed in claim 1 wherein said adjusting step comprises the step of estimating changes occurring in a complex magnitude characteristic of said analog signal over at least portions of symbols so that said symbol timing is adjusted in response to estimated magnitude characteristic change.

6. In a digital communication receiver, a method of recovering symbol timing from an analog signal configured as a stream of symbols, said method comprising the steps of:
   generating a clock signal which defines symbol timing;
   sampling said analog signal in response to said clock signal to generate a complex sample for each symbol;
   identifying clock adjustment opportunities in response to phase relationships exhibited by said complex samples; and
   adjusting said symbol timing defined by said clock signal in response to magnitude relationships exhibited by said complex samples at approximately said identified clock adjustment opportunities.

7. A method of recovering symbol timing as claimed in claim 6 additionally comprising the step of generating a magnitude value and a phase value for each complex sample.

8. A method of recovering symbol timing as claimed in claim 6 wherein said sampling step is configured to sample said analog signal at a rate of less than two complex samples per symbol.

9. A method of recovering symbol timing as claimed in claim 6 additionally comprising the step of detecting data conveyed by said analog signal, said detecting data step being responsive to said complex samples.

10. A method of recovering symbol timing as claimed in claim 6 wherein:
    said identifying step comprises the step of determining changes occurring in said phase relationships; and
    said clock adjustment opportunities are identified in response to said changes in said phase relationships.

11. A method of recovering symbol timing as claimed in claim 10 wherein said identifying step further comprises the steps of:
    defining occurrences of relatively larger phase change as being clock adjustment opportunities; and
    defining occurrences of relatively smaller phase change as not being clock adjustment opportunities.

12. A method of recovering symbol timing as claimed in claim 10 wherein said identifying step further comprises the steps of:
    establishing a threshold which is greater than $\pi/4$;
    defining occurrences of phase change between consecutive symbols which are greater than said threshold as being clock adjustment opportunities; and
    defining occurrences of phase change between consecutive symbols which are less than said threshold as not being clock adjustment opportunities.

13. A method of recovering symbol timing as claimed in claim 6 wherein said adjusting step comprises the step of detecting changes occurring in said magnitude relationships over at least portions of symbols which are substantially coincident with said clock adjustment opportunities.

14. A method of recovering symbol timing as claimed in claim 13 wherein said adjusting step further comprises the step of advancing said symbol timing when an increasing magnitude relationship is detected in said detecting step.

15. A method of recovering symbol timing as claimed in claim 13 wherein said adjusting step further comprises the step of delaying said symbol timing when a decreasing magnitude relationship is detected in said detecting step.

16. A method of recovering symbol timing as claimed in claim 6 wherein:

said sampling step samples said analog signal at sampling instants so that said complex samples and said magnitude relationships thereof correspond to said analog signal at said sampling instants;

said adjusting step comprises the step of interpolating said magnitude relationships exhibited by said complex samples at said sampling instants to estimate magnitude relationships occurring between said sampling instants; and said adjusting step further comprises the step of determining changes between said magnitude relationships and said estimated magnitude relationships.

17. A symbol synchronizer for recovering symbol timing in a digital communication receiver which receives an analog signal configured as a stream of symbols, said symbol synchronizer comprising:

an oscillator for generating a clock signal which defines symbol timing;

an analog-to-digital converter, coupled to said oscillator, for sampling said analog signal to generate a complex sample for each symbol;

a phase processor, coupled to said converter, for identifying clock adjustment opportunities in response to phase relationships exhibited by said complex samples; and a magnitude processor, coupled to said converter, said phase processor, and said oscillator, for adjusting said symbol timing defined by said clock signal in response to magnitude relationships exhibited by said complex samples at approximately said identified clock adjustment opportunities.

18. A symbol synchronizer as claimed in claim 17 additionally comprising a rectangular-to-polar converter having an input coupled to said analog-to-digital converter, having a phase output coupled to said phase processor, and having a magnitude output coupled to said magnitude processor.

19. A symbol synchronizer as claimed in claim 17 wherein said oscillator and said converter are configured to sample said analog signal at a rate of less than two complex samples per symbol.

20. A symbol synchronizer as claimed in claim 17 wherein said phase processor comprises:

a delay element, coupled to said converter, for generating at a current instant a phase relationship exhibited by said complex sample at a past instant; and a subtractor, coupled to said converter and said delay element, for determining changes occurring in said phase relationships between said current and past instants.

21. A symbol synchronizer as claimed in claim 20 additionally comprising a comparison element coupled to said subtractor, said comparison element being configured so that occurrences of relatively larger phase change are defined as being clock adjustment opportunities and so that occurrences of relatively smaller phase change are defined as not being clock adjustment opportunities.

22. A symbol synchronizer as claimed in claim 17 wherein said magnitude processor comprises:

a delay element, coupled to said converter, for generating at a current instant a magnitude relationship exhibited by said complex sample at a past instant, said current and past instants being approximately coincident with one of said clock adjustment opportunities; and a subtractor, coupled to said converter and said delay element, for determining changes occurring in said magnitude relationships between said current and past instants.

23. A symbol synchronizer as claimed in claim 22 wherein said magnitude processor is configured in cooperation with said oscillator so that symbol timing is advanced when said subtractor detects an increasing magnitude relationship during one of said clock adjustment opportunities and so that said symbol timing is delayed when said subtractor detects a decreasing magnitude relationship during one of said clock adjustment opportunities.

24. A symbol synchronizer as claimed in claim 22 wherein:

said oscillator and said converter are configured to sample said analog signal at sampling instants so that said complex samples and said magnitude relationships thereof correspond to said analog signal at said sampling instants; and said delay element comprises an interpolator configured to estimate magnitude relationships occurring between said sampling instants.

* * * * *